United States Patent
Avanzino et al.

[11] Patent Number: 6,051,882
[45] Date of Patent: Apr. 18, 2000

[54] SUBTRACTIVE DUAL DAMASCENE SEMICONDUCTOR DEVICE

[75] Inventors: Steven Avanzino, Cupertino; Subhash Gupta, San Jose; Rich Klein, Mountain View; Scott D. Luning, Menlo Park; Ming-Rin Lin, Cupertino, all of Calif.

[73] Assignee: Advanced Micro Devices, Sunnnyvale, Calif.

[21] Appl. No.: 08/905,974

[22] Filed: Aug. 5, 1997

Related U.S. Application Data

[62] Division of application No. 08/478,321, Jun. 7, 1995, Pat. No. 5,691,238.

[51] Int. Cl.$^7$ .................................................. H01L 23/52
[52] U.S. Cl. .................................... 257/760; 257/758
[58] Field of Search .................................... 438/622, 624, 438/626, 637, 669, 618; 257/758, 760

[56] References Cited

U.S. PATENT DOCUMENTS

| | | |
|---|---|---|
| 4,996,133 | 2/1991 | Brighton et al. . |
| 5,055,426 | 10/1991 | Manning . |
| 5,093,279 | 3/1992 | Andreshak et al. . |
| 5,262,354 | 11/1993 | Cote et al. . |
| 5,371,047 | 12/1994 | Greco et al. . |
| 5,512,514 | 4/1996 | Lee . |
| 5,691,238 | 11/1997 | Avanzino et al. . |
| 5,693,568 | 12/1997 | Liu et al. . |

FOREIGN PATENT DOCUMENTS

| | | | |
|---|---|---|---|
| 4324638 | 2/1994 | Germany | ..................... H01L 21/283 |

*Primary Examiner*—Caridad Everhart
*Attorney, Agent, or Firm*—Foley & Lardner

[57] ABSTRACT

A method of fabricating an interconnection level of conductive lines and connecting vias separated by insulation for integrated circuits and substrate carriers for semiconductor devices using a reverse damascene in the formation of the conductive lines and vias. A conductive line pattern is first used to etch completely through the layer to form conductive line openings. The openings are completely filled with a conductive material and planarized so that the surfaces of the conductive material and the insulating layer are coplanar. A via pattern is aligned perpendicular to the conductive lines and the conductive material is etched half way through the conductive lines in other than the areas covered by the via pattern. The openings thus created in the upper portion of the conductive lines are filled with insulating material to complete the dual damascene interconnection level with the conductive lines in the lower portion of the insulating layer and upwardly projecting vias in the upper portion of the layer. In addition, a triple damascene layer is formed by starting with an insulating layer about one-third thicker than normal and by combining the standard dual damascene method with the above described method. The resulting interconnection level structure comprises conductive lines having upwardly and downwardly projecting vias.

10 Claims, 4 Drawing Sheets

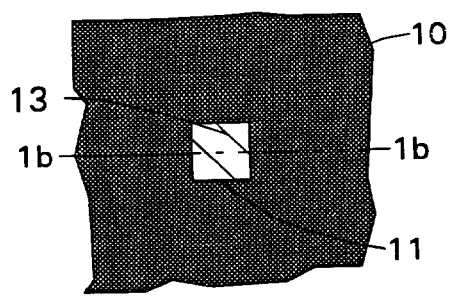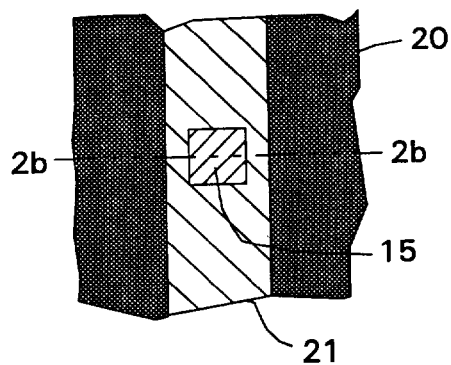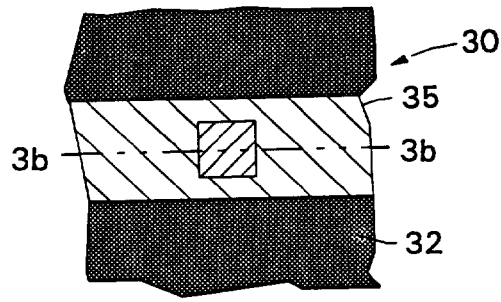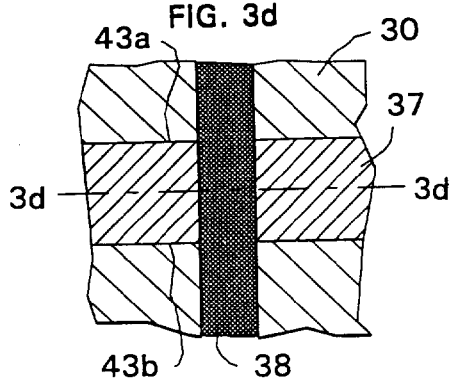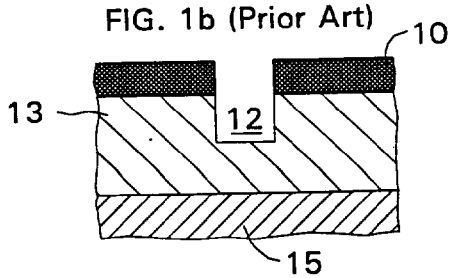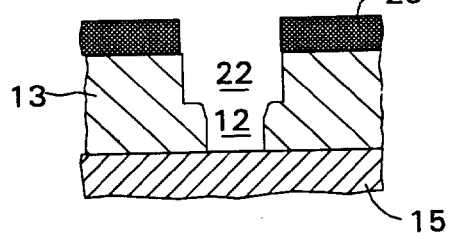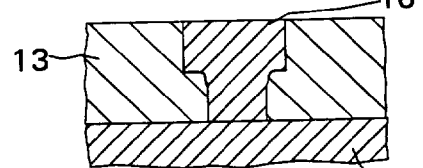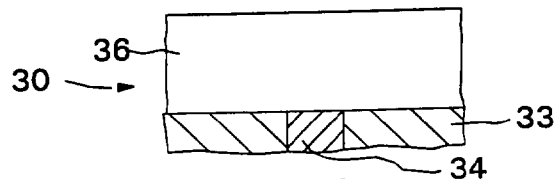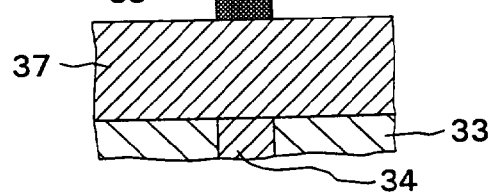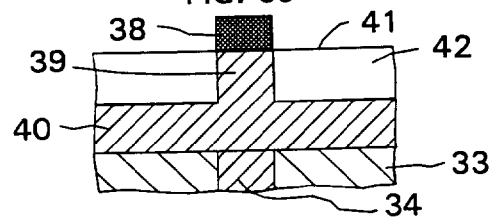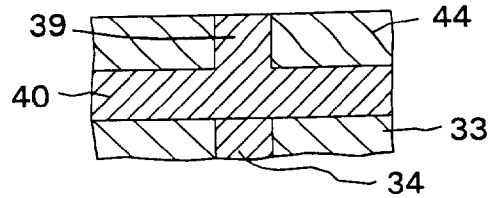

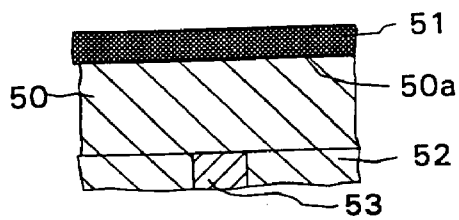
FIG. 4a
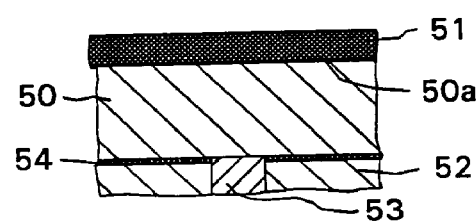
FIG. 4a'
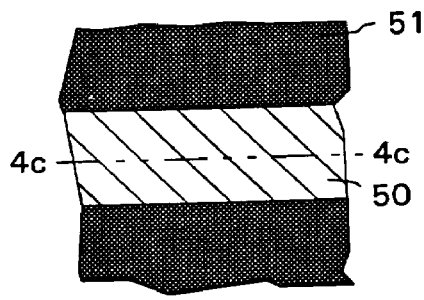
FIG. 4b
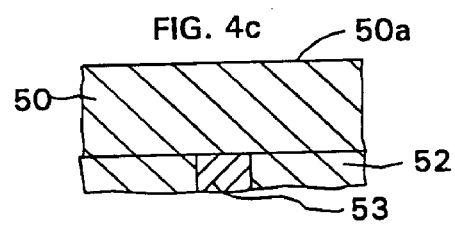
FIG. 4c
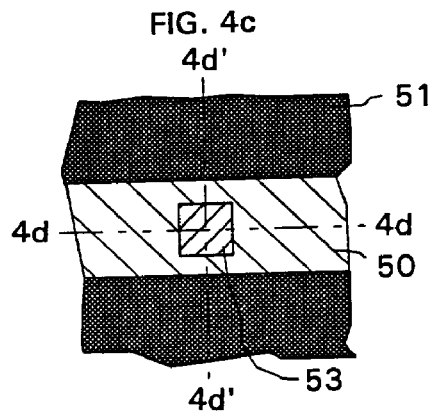
FIG. 4c / FIG. 4d'
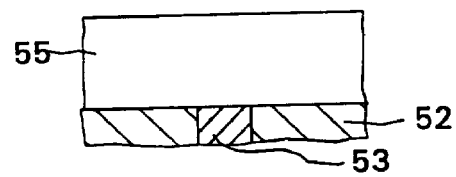
FIG. 4d
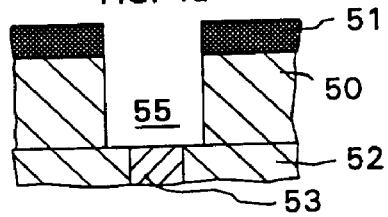
FIG. 4d'
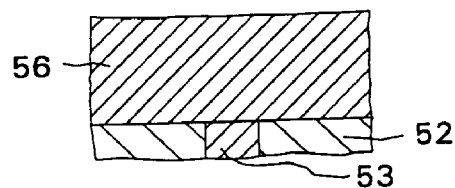
FIG. 4e
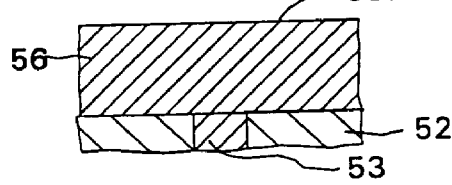
FIG. 4f

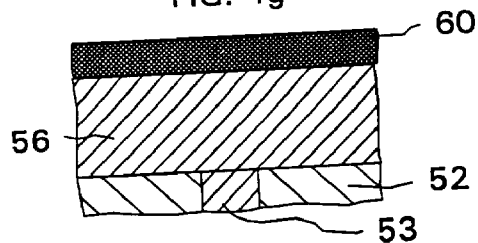
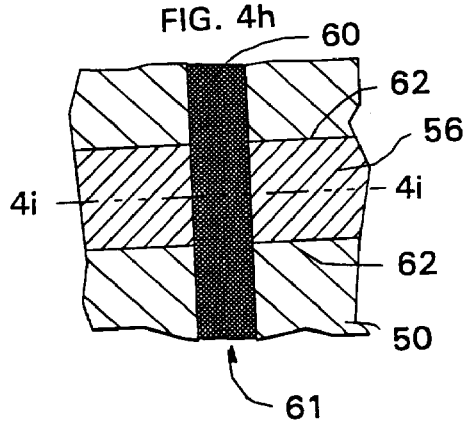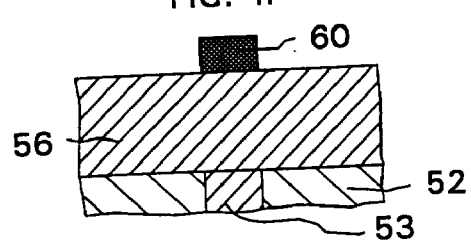
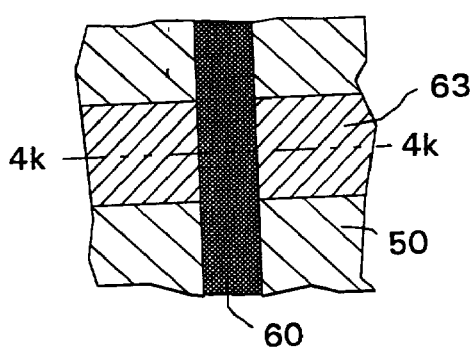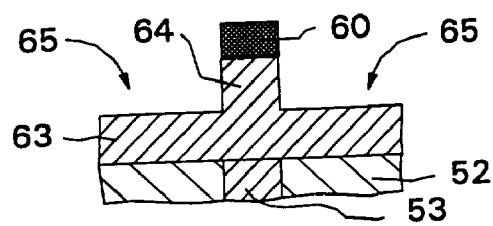
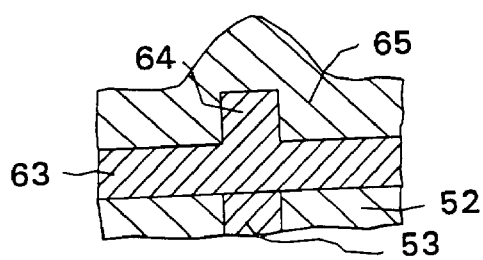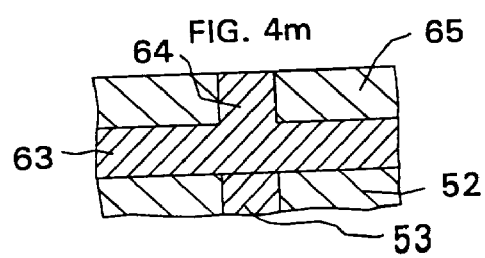

SUBTRACTIVE DUAL DAMASCENE SEMICONDUCTOR DEVICE

CROSS REFERENCES TO RELATED APPLICATIONS

This is a divisional application of U.S. Ser. No. 08/478, 321 filed on Jun. 7, 1995 now U.S. Pat. No. 5,691.238.

This application is related to U.S. patent application Ser. No. 08/478,319, entitled Self Aligned Via Dual Damascene, filed on an even date herewith now U.S. Pat. No. 5,614,765; U.S. patent application Ser. No. 08/478324, entitled Dual Damascene With A Protective Mask For Via Etching also filed on an even date herewith now U.S. Pat. No. 5,686,354; and U.S. patent application Ser. No. 08/486,777, entitled Dual Damascene Within a Sacrificial Via Fill, filed on an even date herewith now U.S. Pat. No. 5,705,430.

BACKGROUND OF THE INVENTION

The present invention generally relates to the fabrication of metal conductive lines and vias that provide the interconnection of integrated circuits in semiconductor devices and/or the interconnections in a multi-layer substrate on which semiconductor device(s) are mounted and, more particularly, to the fabrication of conductive lines and vias by a process known as damascene.

In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect the active and/or passive elements of the integrated circuit. The dual damascene process also is used for forming the multilevel conductive lines of metal, such as copper, in the insulating layers, such as polyimide, of multilayer substrates on which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. In the standard dual damascene process, the insulating layer is coated with a photoresist which is exposed through a first mask with an image pattern of the via openings and the pattern is anisotropically etched in the upper half of the insulating layer. The photoresist now is exposed through a second mask with an image pattern of the conductive lines openings, after being aligned with the first mask pattern to encompass the via openings. In anisotropically etching the openings for the conductive lines in the upper half of the insulating material, the via openings already present in the upper half are etched in the lower half of the insulating material. After the etching is complete, both the vias and the line openings are filled with metal. Dual damascene is an improvement over single damascene because it permits the filling of both the conductive grooves and vias with metal at the same time, thereby eliminating process steps.

Although this standard damascene offers advantages over other processes for forming interconnections, it has a number of disadvantages, such as it requires two masking steps to form the pattern first for the vias and subsequently for the conductive lines. These two masking steps require critical alignment to position the via within groove. It is highly desirable to have the length dimension of the via extend the full width dimension of the conductive line, but, because that would require more critical alignment of the two masks, the via length dimension is designed slightly smaller than the width dimension of the conductive line in the standard dual damascene process. Further, the edges of the via openings in the lower half of the insulating layer, after the second etching, are poorly defined because of the two etchings. Thus, improvements are needed in the standard damascene process to permit the via length to extend of full width of the conductive line without critical alignment of masks and to eliminate the poor edge definition of the via openings.

SUMMARY OF THE INVENTION

The primary object of the present invention is to provide an novel dual damascene process for forming the conductive lines and conducive vias with two mask steps but without requiring critical alignment of the two masks.

Another object of the present invention is to provide an novel dual damascene process and structure in which the length of the conductive via extends the full width of the conductive line.

A still further object of the present invention is provide a novel triple damascene structure and a dual damascene process that is extendable to fabricate the triple damascene structure.

In accordance with the present invention, the positions of the conductive lines and vias in the insulating layer are reversed with respect to standard dual damascene with the conductive lines being in the lower portion of the insulating layer and the vias being in the upper portion of the insulating layer. A first resist pattern in the resist for the conductive lines is etched the full thickness of the insulating layer. Metal for the conductive lines then is deposited in the etched opening to fill the openings above the upper surface of the insulating layer. After planarizing, a second resist pattern, which is aligned perpendicular to the alignment of the first resist pattern, covers the vias to-be-formed with resist. The deposited metal is etched partially through the thickness of the deposited metal to form vias the full width across the conductive lines.

In accordance with another aspect of the present invention, the conductive mask is preceded with a standard via mask for dual damascene and the insulating layer is substantially thicker so that the standard dual damascene opening is formed in the insulating layer with the lower portion of the opening being the via opening and the upper portion being the conductive line. After the opening is filled with metal, the second mask of the present invention is used to form the pattern for creating the upper via as described above.

The resulting novel triple damascene structure comprises a conductive material having a conductive line with at least one section disposed between and unitary with a lower conductive via which does not extend the full width of the conductive line and an upper via which does extend the full width of the conductive line and, except for the upper surface of the upper via and the lower surface of the lower via, the unitary piece of conductive material is surrounded by an insulating material at this section of conductive line so as to provide an electrical connection between either a lower semiconductor device contact or lower conductive line and an upper conductive line.

BRIEF DESCRIPTION OF THE DRAWINGS

The foregoing and other objects, aspects and advantages will be better understood from the following detailed description of the preferred and other embodiments of the present invention with reference to the drawings, in which:

FIG. 1a (Prior Art) is a plan view of a portion of an exposed and developed via resist pattern on an etched insulating layer used in the standard dual damascene process.

FIG. 1b (Prior Art) is a cross-sectional view of the patterned resist and etched insulating layer of FIG. 1a taken across 1b—1b of FIG. 1a.

FIG. 2a (Prior Art) is a plan view of a portion of an exposed and developed conductive line resist pattern on the etched insulating layer used in the standard dual damascene process.

FIG. 2b (Prior Art) is a cross-sectional view of the patterned resist and etched insulating layer of FIG. 2a taken across 2b—2b of FIG. 2a.

FIG. 2c (Prior Art) is a cross-sectional view of the opening in the insulating layer of FIG. 2b filled with metal.

FIG. 3a is a plan view of a portion of a first mask of the present invention.

FIG. 3b is a cross-sectional view of an insulating layer exposed to the pattern of the mask of FIG. 3a taken across 3b—3b of FIG. 3a and filled with metal.

FIG. 3d is a plan view of a portion of a second mask of the present invention.

FIGS. 3c and 3e–3f are is a cross-sectional view of the metal filled insulating layer of FIG. 3b exposed to the pattern of the mask of FIG. 3d taken across 3d—3d of FIG. 3d.

FIGS. 4a through 4m are sequential plan and cross-sectional views of the steps used to fabricate dual damascene metallization in an insulating layer in accordance with one embodiment of the present invention.

DETAILED DESCRIPTION OF THE PREFERRED EMBODIMENTS OF THE INVENTION

Figure 5A:
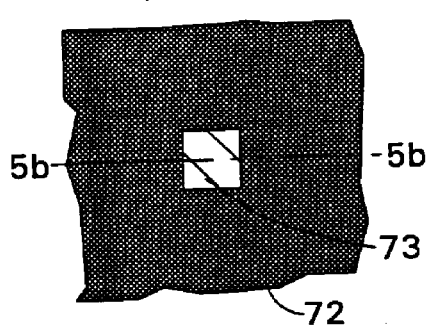
FIGS. 5a through 5i are sequential plan and cross-sectional views of the steps used to fabricate triple damascene metallization in an insulating layer in accordance with another embodiment of the present invention.

Referring now to the drawings and, more particularly to FIGS 1a and 1b and FIGS. 2a and 2b, there is illustrated the standard method for forming dual damascene openings for a conductive lines and vias. FIG. 1a shows a portion of a positive resist 10 with one pattern opening 11 which is used to define a via opening 12 in an insulating layer 13 for etching a via opening in the insulating layer. As shown in FIG. 1b, the via opening 12 is etched in the upper portion of the insulating layer corresponding to pattern opening 11. The insulating layer 13 is disposed on a completed metallized insulating layer (not shown) containing a conductive line 15 to be physically contacted and electrically connected to an upper conductive line through a via, when formed. After the via opening 12 is formed, a resist layer 20 containing a conductive line pattern 21, and shown in FIG. 2a, is aligned with the via opening 12. The conductive line pattern 21, which is wider than the via opening 12, is anisotropically etched in the upper portion of the insulating layer to form the conductive line opening 22. Simultaneously with this etching, the via opening 12, which is exposed to the same etchant gas(es), is etched (and replicated) in the lower portion of insulating layer 13 to the underlying conductive line 15 which serves as an etch stop. Next, the openings 12, 22 for the conductive line and conductive via, respectively, are filled with metal 16 to make physical contact with and electrical connection to the conductive line 15.

Although the standard dual damascene method provides advantages over other metallization methods, it requires two photographic masks which must be aligned with a high degree of accuracy in VLSI semiconductor devices and with even a greater degree accuracy in ULSI devices. If misalignment occurs, there can be opens created in the interconnections of the conductive lines and vias. In addition, the two etching steps of vias causes the corners of the vias to become ragged because they are not protected during the second etch.

These disadvantages are overcome by the method of the present invention as generally shown in FIGS. 3a, 3b, 3c, 3d and 3e. As illustrated in FIG. 3a, a portion of an insulating layer 30, with a layer 32 of commercially available resist, is carried on an underlying insulating layer 33 with completed interconnection metallization as shown by the conductive via 34 as representative of one part of the interconnection. The resist layer 32 is formed with a conductive line pattern 35 and anisotropically etched to leave a conductive line opening 36 as shown in FIG. 3b, with the resist 32 serving as an etch barrier as shown in FIG. 3a. After the resist is removed by a conventional technique such as ashing, the conductive line opening 36 is filled with metal 37, such as aluminum. Next, as shown in FIGS. 3c and 3d, the insulating layer with the conductive line metal 37 is covered with a resist layer 38, containing a via pattern and is positioned herein perpendicular to the conductive line metal 37 for etching a conductive via or stud in the metal. In the accordance with one aspect of the present invention, the via resist pattern 38, unlike the via resist pattern of the prior art, can extend beyond the width of the conductive line metal 37, as shown in FIG. 3d, because the uncovered insulating layer 30 is resistant to subsequent etch gas(es). With the via resist 38 serving as an etch barrier, the metal 37 is etched approximately half way through the metal in the conductive line opening 36 except where the resist covers the metal to form an unitary upwardly projection via 39 from a conductive line 40 from the middle of the insulating layer 30 to its upper surface 41, as shown in FIG. 3e. Where the metal 37 is not masked by the resist 38, it is removed from the upper portion 42 of the insulating layer 30 as shown in FIG. 3e. By the method of the present invention, the conductive via 39 extends the full width of the conductive line 37 and abuts the walls 43a and 43b of the insulating layer 30 as shown in FIG. 3d. With the conductive line 37 and conductive via 39 thus formed, the upper portion 42 (FIG. 3e) of the insulating layer 30 is filled with insulation 43 as shown in FIG. 3f.

With this general description of the present invention as background, reference will now be made to one of the preferred embodiments as shown by the sequence of steps of FIGS. 4a through 4m. In FIG. 4a, an insulating layer 50, of herein silicon dioxide ($SiO_2$) of about 1.6 to 2.0 microns, is shown with a commercial positive resist 51 on its upper surface 50a and is carried on a completed interconnection insulating layer 52 with a via 53 representing a part of that interconnection layer. Alternatively, as shown in FIG. 4a', a thin etch stop layer 54 covers the top of layer 52 to protect the layer 52 during a subsequent etch. The resist 51, as shown in FIG. 4b is patterned in the form of the conductive line. Next, as shown in FIGS. 4c through 4d, the complete thickness of the insulating layer 50 of $SiO_2$ is anisotropically or unidirectionally etched with suitable gases, such as carbon tetrafluoride or other fluorine containing gases, and herein is timed etched with a plasma gas comprising carbon tetrafluoride ($CF_4$) and at least 40% hydrogen ($H_2$), with the resist 51 serving as an etch barrier. This etching step forms a conductive line opening 55 in the insulating layer 50, as shown in FIGS. 4d and 4d' and, after being formed, the resist layer 51 is removed by ashing in an oxygen plasma. Now, a metal, which herein is aluminum doped with about 1% of copper (Al/1% Cu), is sputter deposited by commercial sputter equipment in the conductive line opening 55 to completely fill the opening with conductive line metal and make physical contact with the via 53 in the underlying insulating layer 52, as illustrated FIG. 4e. The deposited metal over fills the opening 55 and the excess metal is removed by conventional means, such as chemical/mechanical (chem/mech) polishing to coplanarize the surface 56a of the conductive line metal 56 with the surface 50a of the insulating layer 50.

After the surfaces 50a, 56a are planarized, a second commercial positive resist 60 is patterned on the insulating-metal surface 50a and 56a to define a via or stud pattern 61 as shown in FIGS. 4h and 4i. The resist 60 remains over the area of the conductive line metal 56 where the via is to be formed and, serves as an etch mask. It will be noted that the resist pattern extends across the conductive line which eliminates the need of critical alignment of the first and second masks and which will permit the to-be-formed conductive via or stud to abut the insulating material/metal interface 62. Herein, half the thickness of the deposited metal in the insulating layer not covered with the resist 60 is anisotropically or unidirectionally etched with suitable plasma gases, such as boron trichloride ($BCl_3$) and chlorine ($Cl_2$), in a commercially available etcher as described above. In etching the metal, the exposed surface 50a of the insulating layer 50 is not protected with an etch barrier because the insulating layer is resistant to or highly less selective to the plasma gas(es) of as $BCl_3$ and $Cl_2$. Upon completion of the etching, a conductive line 63 is formed in the lower half of the insulating layer and an upwardly projecting conductive via or stud 64 is formed in the upper half as best shown in FIG. 4k. Now, after removal of the resist 60 by ashing, as previously described, the openings 65 (FIG. 4k) above the conductive lines 63 are filled with an insulating material 66, herein $SiO_2$ deposited by chemical vapor deposition (CVD) using silane ($SiH^4$) and oxygen ($O_2$) or any other appropriate silicon containing gas, such as tethcelhylorthosilicate (TEOS) or tetra methylcyclotetrasiloxane (TMCTS). After being filled with insulating material, the surfaces 50a and 56a are again planized, in the present instance, by chem/mech polishing with commercial equipment and slurry, in preparation for the next level of metallization for interconnections.

Figure 5B:
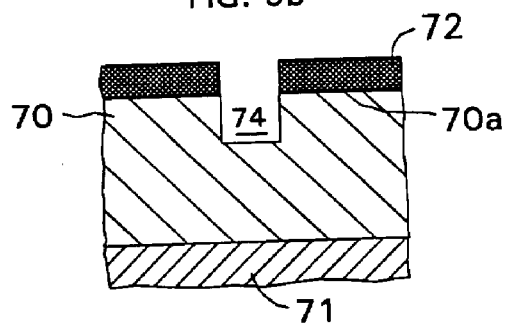
Figure 5C:
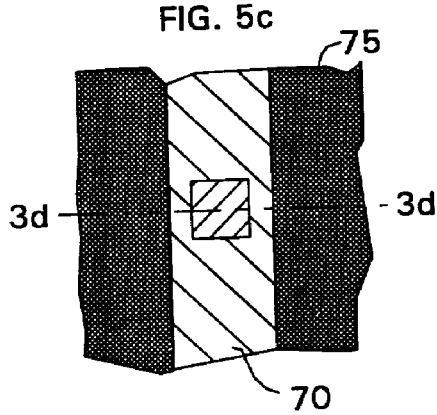
Figure 5D:
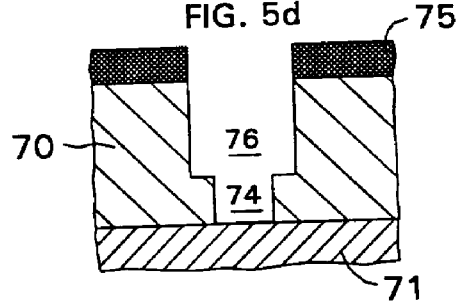
Figure 5E:
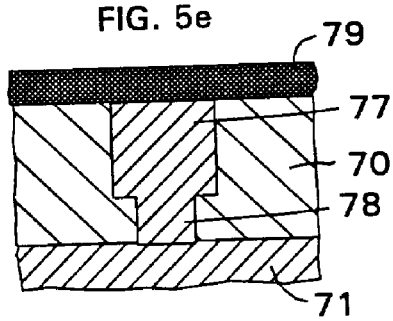
Figure 5G:
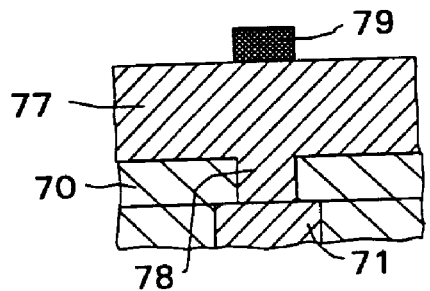
Figure 5F:
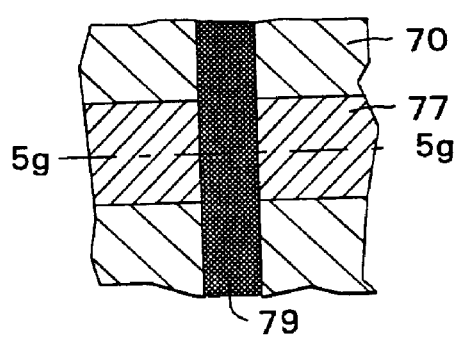
Figure 5H:
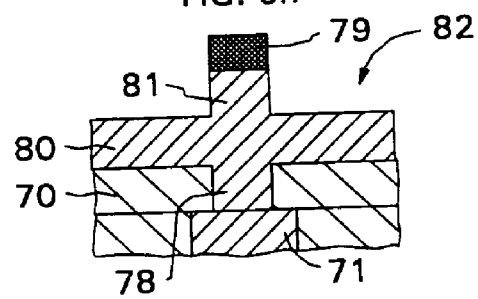

In accordance with another aspect of the present invention, the standard dual damascene process can be combined with the process of the present invention to provide a triple level damascene process and a triple level structure of unitary interconnection as shown in FIGS. 5a through 5i. In this combined process, an insulating layer 70, which is herein one-third thicker than normal, or herein is about 2.4 to 3.0 microns of $SiO_2$, is carried on a completed interconnection layer of which a portion of a conductive line 71 is representative. As in the standard dual damascene, a patterned commercial positive resist layer 72 with a via opening 73, as shown in FIG. 5a and 5b, is deposed on the surface 70a of the insulating layer 70. Using the resist pattern as an etch barrier, the upper third 74 of the insulating layer 70 is timed etched using herein a plasma gas comprising carbon tetrafluoride ($CF_4$) and at least 40% hydrogen ($H_2$). Next, the first resist pattern 75 of the previous embodiment provides the pattern for a conductive line opening 76 in alignment with the previous via opening 73. With the resist pattern 75 serving as etch mask on the surface of the insulating surface, the insulating layer 70 is etched two-thirds through the insulating layer, with the via pattern being etched in the remaining lower one-third to reach and stop on the underlying conductive line 71 performing as an etch stop, thereby creating a via opening 74 and a conductive line opening 76 in the insulating layer 70 as shown in FIGS. 5c and 5d. After removal of the resist, such as by ashing, the via and conductive line openings, 74 and 76 are filled with metal 77, herein Al/1% Cu, to form a conductive via 78 in physical contact with the underlying conductive line 71. The excess metal on the surface of the insulating layer is removed by herein chem/mech polishing (not shown) and the metal surface is coplanarized with the surface of the metallized insulating layer 70 in preparation for a via resist pattern 79 as shown in FIG. 5g and FIG. 5h. The via resist pattern 78 serves as a etch mask for etching the metal 77. Again, $BCl_3$ and $Cl_2$ are used as the etching gases and the metal unprotected by the resist pattern 79 is etched one-third the way through the total thickness of the metal to create in addition to the first conductive via 78 in contact with the underlying conductive line 71, a conductive line 80 and a second conductive via or stud 81 as shown in FIG. 5h. After the resist is removed by ashing, the remaining etched openings 82 (FIG. 5h) are filled with an insulating material 83, herein $SiO_2$, as previously described. Then, the surface 84 of the insulating material 83 is coplanarized with the metal surface to yield the cross-sectional view of FIGS. 5i. Thus, by combining the standard dual damascene process with the method of the present invention present invention, a triple damascene process and an unitary structure of a section of a conductive line with upper and lower vias results.

Figure 5I:
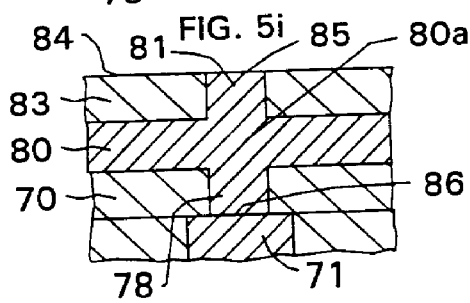

The novel triple damascene structure comprises a conductive material having a conductive line 80 with at least one section 80a disposed between and unitary with a lower conductive via 78 which does not extend the full width of the conductive line and an upper via 81 which does extend the full width of the conductive line as both are shown in FIG. 5i. Except for the upper surface 85 of the upper via 81 and the lower surface 86 of the lower via 78, the unitary piece of conductive material is surrounded by an insulating material 70 and 83 at this section of conductive line so as to provide an insulated electrical connection between either a lower semiconductor device contact or lower conductive line and an upper conductive line.

Although this invention has been described relative to specific insulating materials, conductive materials and apparatus for depositing and etching these materials, it is not limited to such materials and other materials and apparatuses for depositing and etching insulating and conductive materials can be substituted as is well understood by those skilled in the microelectronics and multilayer interconnection arts. Further, although the embodiments of the present invention is directed to damascene on semiconductor devices, it also will be recognized by those skilled in the fabrication of multilayer interconnection substrates arts that the present invention can be used in manufacturing those substrates to interconnect one or more semiconductor devices (chips) into a higher level electronic system. Such multilevel or multilayer substrates uses organic insulating layers, such as polyimide, and conductive lines, such as copper. The subtractive damascene process of the present invention is well suited for the manufacture of such multilevel insulating and conductive layers with connecting conductive vias.

We claim:

1. An integrated circuit semiconductor device having a semiconductor body with a plurality of active devices and multilevel interconnections with metal contacts disposed on the semiconductor body for electrically connecting the active devices to each other through the multilevel interconnection and the metal contacts and with at least one level of interconnection comprising:

a single insulating layer with a lower surface and an upper surface having at least a first portion and a second portion;

a conductive metal line disposed in said second portion for electrically connecting either one of said active devices or another level of interconnection through at least one of said metal contacts, said metal contact being disposed in another insulating layer in abutting contact with the lower surface of said single insulating layer;

a metal via in said first portion which is the same metal as the metal of said conductive line and aligned and unitary with and extending upward from the conductive line; and an insulating material having an upper surface disposed on said conductive metal line and abutting said metal via and having a thickness substantially equal to said upward extension of the via whereby the upper surface of said insulating material is in the same plane as the upper surface of said single insulating layer.

2. The semiconductor device of claim 1 wherein said single insulating layer includes a third portion having a metal via aligned and unitary with said conductive metal line and extending downward to connect to either an element of one of said devices or another level of interconnection.

3. The semiconductor device of claim 1 wherein composition of said insulation material is different from the composition of said single insulating layer.

4. The semiconductor device of claim 1 wherein said insulating layer is an oxide of silicon.

5. The semiconductor device of claim 1 wherein said conductive metal line and metal via are the same metal and are either aluminum or an alloy of aluminum.

6. A multilevel interconnection structure for electrically connecting active devices to each other through multilevel interconnections and metal contacts and with at least one level of interconnection comprising:

a single insulating layer with a lower surface and an upper surface having at least a first portion and a second portion;

a conductive metal line disposed in said second portion for electrically connecting either one of said active devices or another level of interconnection through at least one of said metal contacts, said metal contact being disposed in another insulating layer in abutting contact with the lower surface of said single insulating layer;

a metal via in said first portion which is the same metal as the metal of said conductive line and aligned and unitary with and extending upward from the conductive line; and an insulating material having an upper surface disposed on said conductive metal line and abutting said metal via and having a thickness substantially equal to said upward extension of the via whereby the upper surface of said insulating material is in the same plane as the upper surface of said single insulating layer.

7. The multilevel interconnection structure of claim 6 wherein said single insulating layer includes a third portion having a metal via aligned and unitary with said conductive metal line and extending downward to connect to either an element of one of said devices or another level of interconnection.

8. The multilevel interconnection structure of claim 6 wherein composition of said insulation material is different from the composition of said insulating layer.

9. The multilevel interconnection structure of claim 6 wherein said single insulating layer is an oxide of silicon.

10. The multilevel interconnection structure of claim 6 wherein said conductive metal line and metal via are the same metal and are either aluminum or an alloy of aluminum.

* * * * *